US012677615B2

(12) United States Patent
Yamamoto

(10) Patent No.: US 12,677,615 B2
(45) Date of Patent: Jul. 7, 2026

(54) METHOD FOR PROCESSING DEVICE WAFER

(71) Applicant: DISCO CORPORATION, Tokyo (JP)

(72) Inventor: Naoko Yamamoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 408 days.

(21) Appl. No.: 18/457,028

(22) Filed: Aug. 28, 2023

(65) Prior Publication Data

US 2024/0079245 A1 Mar. 7, 2024

(30) Foreign Application Priority Data

Sep. 2, 2022 (JP) ................................. 2022-139735

(51) Int. Cl.
| | |
|---|---|
| *H10P 50/24* | (2026.01) |
| *H10P 52/00* | (2026.01) |
| *H10P 72/70* | (2026.01) |
| *B23K 26/38* | (2014.01) |
| *B23K 26/40* | (2014.01) |
| *B23K 101/40* | (2006.01) |

(52) U.S. Cl.
CPC ............ *H10P 50/242* (2026.01); *H10P 52/00* (2026.01); *H10P 72/74* (2026.01); *B23K 26/38* (2013.01); *B23K 26/40* (2013.01); *B23K 2101/40* (2018.08); *H10P 72/7416* (2026.01)

(58) Field of Classification Search
CPC ............ H01L 21/3065; H01L 21/3043; H01L 21/6835; H01L 2221/68327; H01L 21/67092; H01L 21/78; B23K 26/38; B23K 26/40; B23K 2101/40
USPC ....................................................... 438/462
See application file for complete search history.

(56) References Cited

U.S. PATENT DOCUMENTS 4,325,182 A * 4/1982 Tefft .................... H01L 21/3065
                                                     438/561
6,465,158 B1 * 10/2002 Sekiya ................ H01L 21/3043
                                                     430/311
7,459,377 B2 * 12/2008 Ueda ...................... B82Y 20/00
                                                     438/460

(Continued)

FOREIGN PATENT DOCUMENTS

| JP | 2016201412 A | 12/2016 |
|---|---|---|
| JP | 202053473 A | 4/2020 |
| JP | 2022035863 A | 3/2022 |

OTHER PUBLICATIONS

Japanese Patent Application No. 2022-139735: English translation of Office Action, Feb. 17, 2026 (2 pages).

*Primary Examiner* — Vu A Vu
(74) *Attorney, Agent, or Firm* — Greer, Burns & Crain, Ltd

(57) ABSTRACT

Disclosed is a method for processing a device wafer, in which a device layer, the device layer constituting devices, is stacked on a base material and the devices are formed, respectively, in regions defined by a plurality of intersecting streets on a front surface of the base material. The method includes a first step of dividing the device layer along the streets, a second step of dividing the base material by plasma etching along the streets, and a third step of, before performing at least the second step, forming half-cut grooves by a cutting blade or a laser beam in the base material along the streets, respectively, from a side of a front surface or a side of a back surface of the device wafer. The third and second steps are performed from the side of the same surface of the device wafer.

10 Claims, 9 Drawing Sheets

(56)             References Cited

U.S. PATENT DOCUMENTS

| | | | | |
|---|---|---|---|---|
| 7,507,638 B2 * | 3/2009 | Mancini | .................. | H01L 21/78 |
| | | | | 438/459 |
| 7,906,410 B2 * | 3/2011 | Arita | ....................... | H01L 21/78 |
| | | | | 438/460 |
| 8,012,805 B2 * | 9/2011 | Arita | ....................... | H01L 21/78 |
| | | | | 438/460 |
| 8,883,615 B1 * | 11/2014 | Holden | ................. | H01L 21/428 |
| | | | | 257/737 |
| 8,980,727 B1 * | 3/2015 | Lei | ...................... | C03C 23/0025 |
| | | | | 438/464 |
| 8,993,414 B2 * | 3/2015 | Eaton | .................... | B23K 26/40 |
| | | | | 438/465 |
| 9,484,260 B2 * | 11/2016 | Grivna | .............. | H01L 21/67132 |
| 9,564,366 B2 * | 2/2017 | Martinez | .......... | H01J 37/32623 |
| 9,852,997 B2 * | 12/2017 | Park | ..................... | B23K 26/402 |
| 10,410,923 B2 * | 9/2019 | Sandoh | ............. | H01L 21/32136 |
| 10,796,962 B2 * | 10/2020 | Wakahara | ............. | H01L 21/268 |
| 10,818,551 B2 * | 10/2020 | Seddon | ............... | H01L 21/3065 |
| 10,923,357 B2 * | 2/2021 | Itou | ................... | H01L 21/68735 |
| 2020/0098636 A1 | 3/2020 | Harikai et al. | | |

* cited by examiner

START

PLASMA ETCHING OF DEVICE LAYER        S1

FORMATION OF HALF-CUT GROOVES
FROM FRONT SURFACE SIDE        S2

PLASMA ETCHING OF BASE MATERIAL
FROM FRONT SURFACE SIDE        S3

REMOVAL OF MASK FROM FRONT
SURFACE        S4

END

FIG.4A
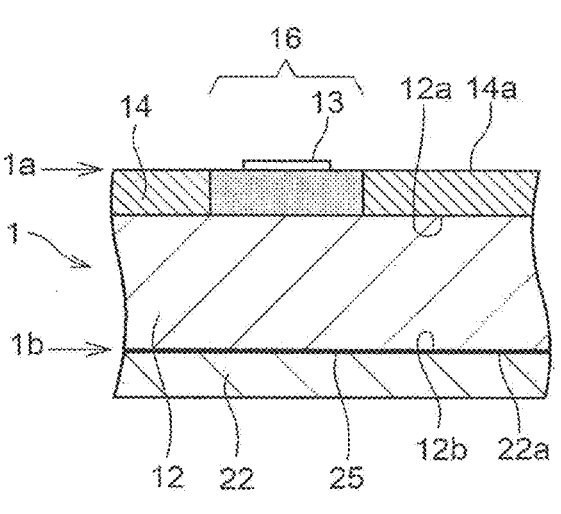
FIG.4B
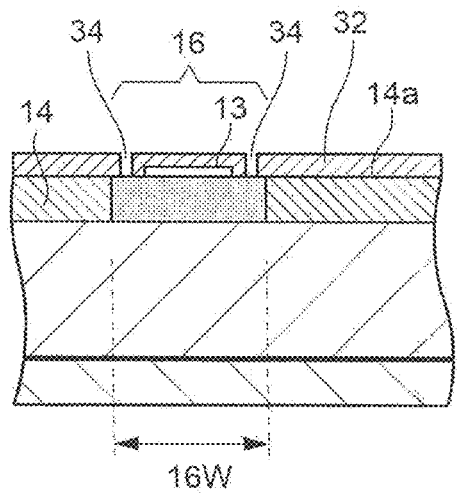
FIG.4C
FIG.4D
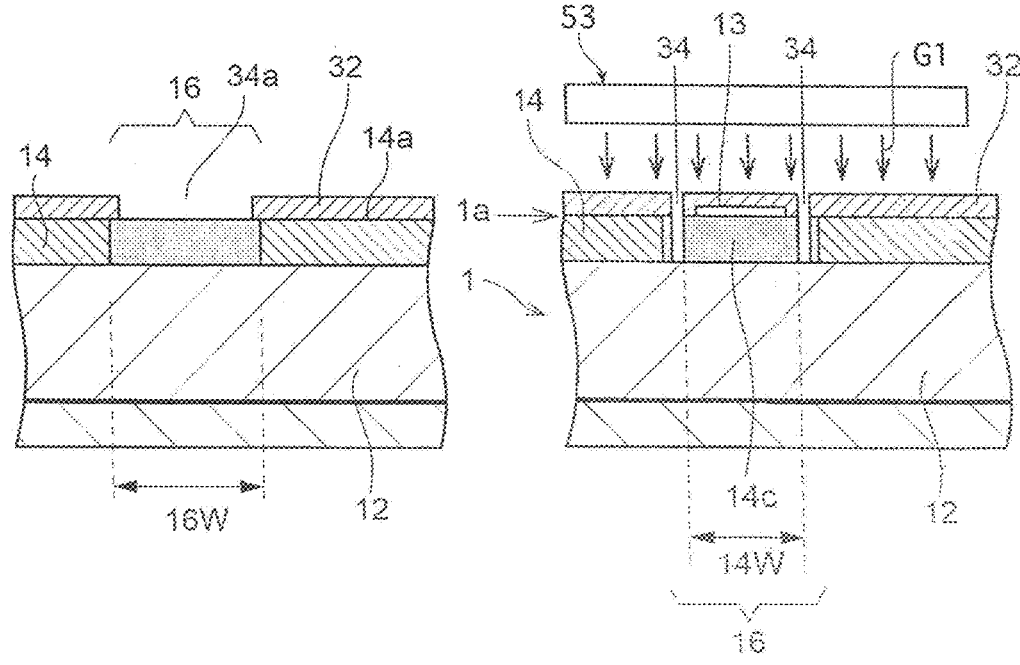

METHOD FOR PROCESSING DEVICE WAFER

BACKGROUND OF THE INVENTION

Field of the Invention

The present invention relates to a method for processing a device wafer, especially to plasma dicing that divides the device wafer into chips by plasma etching.

Description of the Related Art

Plasma dicing is conventionally and widely used in manufacturing processes of semiconductor devices, which dislike adhesion of contaminants, because in processing to divide semiconductor wafers, no processing debris occurs when diced by plasma etching as disclosed, for example, in JP 2022-035863A as opposed to occurrence of processing debris in laser dicing or blade dicing.

In a device wafer, a layer that constitutes devices is stacked on a front surface of a base material such as silicon, and the devices are formed, respectively, in individual regions defined by a plurality of intersecting streets on the front surface. When performing plasma dicing on such a device wafer, plasma etching is applied to all the streets at the same time, whereby the device wafer is divided at once along the individual streets.

SUMMARY OF THE INVENTION

It takes time to divide a base material along streets in plasma dicing, and therefore shorter dividing time is earnestly desired. Especially, if a device wafer with a base material of large thickness is subjected to plasma dicing, it is desired to enable the division of the base material in a shorter time.

The present invention therefore has as an object thereof the provision of a method for processing a device wafer, which can further shorten the processing time when dividing the device wafer into chips by plasma dicing.

In accordance with an aspect of the present invention, there is provided a method for processing a device wafer, in which a device layer, the device layer constituting devices, is stacked on a base material and the devices are formed, respectively, in regions defined by a plurality of intersecting streets on a front surface of the base material. The method includes a first step of dividing the device layer along the streets, a second step of dividing the base material by plasma etching along the streets, and a third step of, before performing at least the second step, forming half-cut grooves by a cutting blade or laser beam in the base material along the streets from one of a side of a front surface or a side of a back surface of the device wafer. The third step and the second step are performed from the side of the same surface of the device wafer.

In accordance with another aspect of the present invention, there is provided a method for processing a device wafer, in which a device layer, the device layer constituting devices, is stacked on a base material and the devices are formed, respectively, in regions defined by a plurality of intersecting streets on a front surface of the base material. The method includes a first step of dividing the device layer by plasma etching along the streets, a second step of dividing the base material by plasma etching along the streets, and a third step of, before performing at least the second step, forming half-cut grooves by a cutting blade or laser beam in the base material along the streets from one of a side of a front surface or a side of a back surface of the device wafer. The third step and the second step are performed from the side of the same surface of the device wafer.

Preferably, metal structures may be formed in each of the streets, two grooves may be formed along each street in the first step so that the two grooves may divide the device layer and may flank the metal structures, and after the first step has been performed, the third step may be performed, and the second step may then be performed.

Preferably, the base material may be removed along with the metal structures along each street from the side of the front surface of the device wafer in the third step, so that the half-cut groove may be formed in the base material and a remaining portion of the base material may be formed below the half-cut groove, and in the second step, a plasma gas may be supplied from the side of the front surface of the device wafer, so that plasma etching may be performed on the remaining portion and processing debris occurred upon the formation of the half-cut groove in the third step may be removed.

Preferably, in the third step, the half-cut groove may be formed in the base material from the side of the back surface of the device wafer, and a remaining portion of the base material is formed below the half-cut portion, and in the second step, a plasma gas may be supplied from the side of the back surface of the device wafer, so that plasma etching may be performed on the remaining portion and processing debris occurred upon the formation of the half-cut groove in the third step may be removed.

According to the present invention, the processing debris formed upon the formation of the half-cut groove along each street is also removed when the remaining portion of the base material, which has been formed along each street, is removed by plasma etching. Processing debris that occurs by laser dicing or blade dicing is therefore prevented from remaining as contaminants. Further, owing to the formation of the half-cut groove along each street before the plasma etching of the base material, the thickness of the base material to be removed by the plasma etching (in other words, the thickness of the remaining portion) is reduced, thereby enabling to shorten the processing time.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 4A is a fragmentary cross-sectional view of the device wafer fixed on a support member in a first step of the processing method of FIG. 3;

FIG. 4B is a fragmentary cross-sectional view depicting formation of a mask on a front surface of the device layer in the first step;

FIG. 4C is a fragmentary cross-sectional view depicting a case, in which no metal structures exist in each street, in the first step;

FIG. 4D is a fragmentary cross-sectional view depicting plasma etching of the device layer in the first step;

FIG. 5A is a fragmentary cross-sectional view depicting formation of a half-cut groove along each street in a second step of the processing method of FIG. 3;

FIG. 5B is a fragmentary cross-sectional view depicting the half-cut groove formed along the street in the second step;

FIG. 5C is a fragmentary cross-sectional view depicting plasma etching of the base material along the street in a third step of the processing method of FIG. 3;

FIG. 5D is a fragmentary cross-sectional view depicting a state, in which the mask has been removed from the front surface of the device layer, in a fourth step of the processing method of FIG. 3;

DETAILED DESCRIPTION OF THE PREFERRED EMBODIMENTS

Figure 1A:
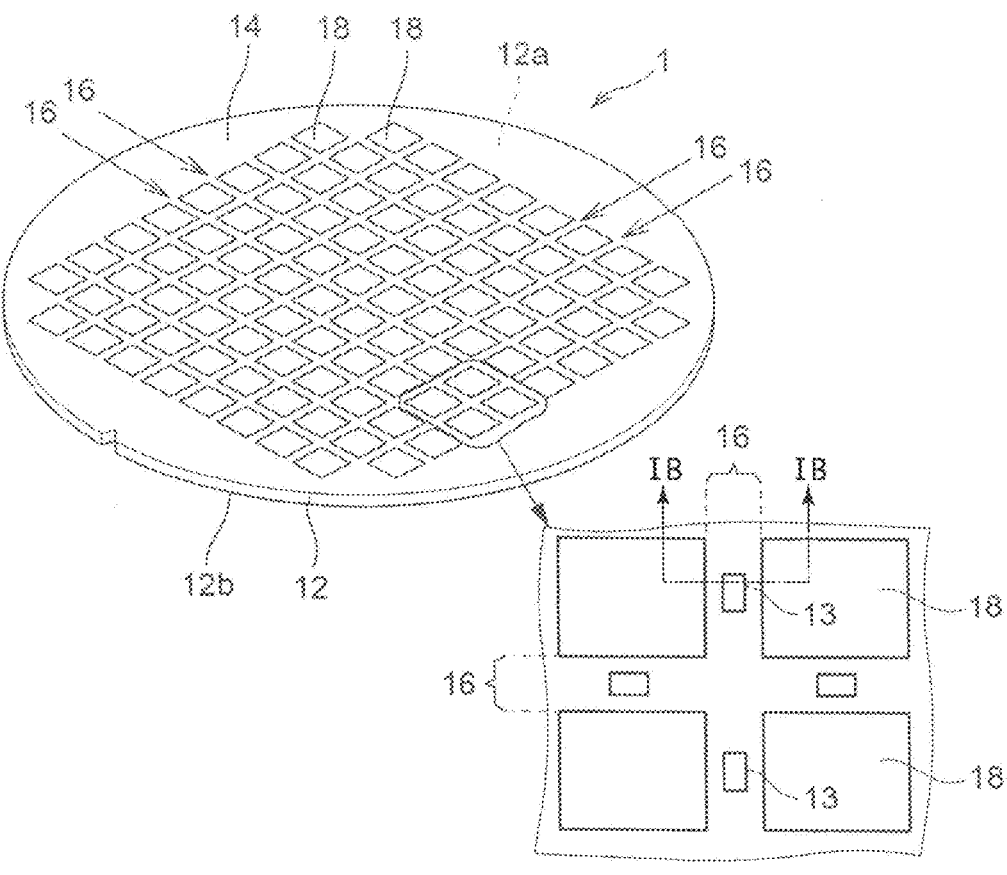
FIG. 1A is a perspective view depicting an example of a device wafer to which a processing method according to the present invention is applied, and including an enlarged fragmentary top view of a front surface of the device wafer.
Figure 1B:
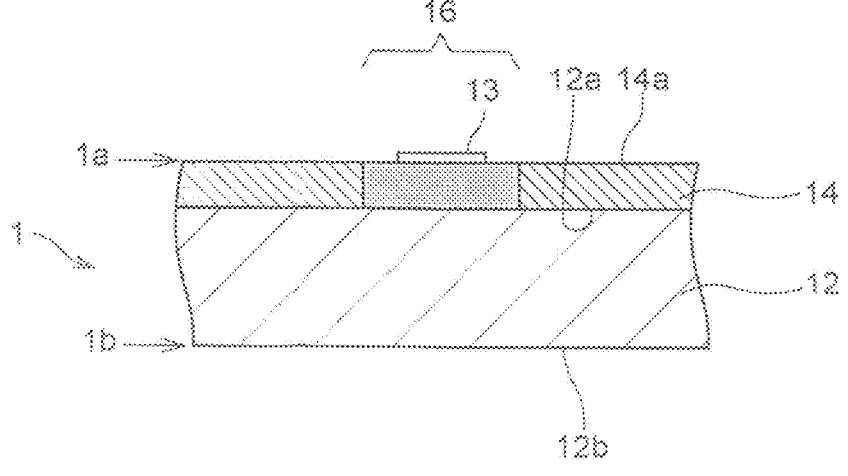
FIG. 1B is a fragmentary cross-sectional view of the device wafer as taken along line IB-IB of FIG. 1A.

With reference to the attached drawings, a description will hereinafter be made about embodiments of the present invention. FIGS. 1A and 1B depict an example of a device wafer 1 to be processed in the present invention. As depicted in FIGS. 1A and 1B, the device wafer 1 includes a base material 12, and a device layer 14 formed on a front surface 12a of the base material 12.

The base material 12 is, for example, silicon, and is formed in a disk shape. The device layer 14 is constituted of, for example, a plurality of interlayer dielectrics made from $SiO_2$ and a plurality of layers of circuit-forming metal (metal circuits) alternately stacked together.

In the device layer 14, regions that are defined by a plurality of intersecting streets 16 and 16 serve as device regions, and devices 18 are formed in the respective device regions.

Test element groups (TEGs) 13 and other metal structures exist in each street 16. The TEGs 13 and other metal structures may be formed so that they are exposed on the device layer 14, or may be formed inside the device layer 14. There is also a case in which no metal structures exist in each street 16.

Figure 2:
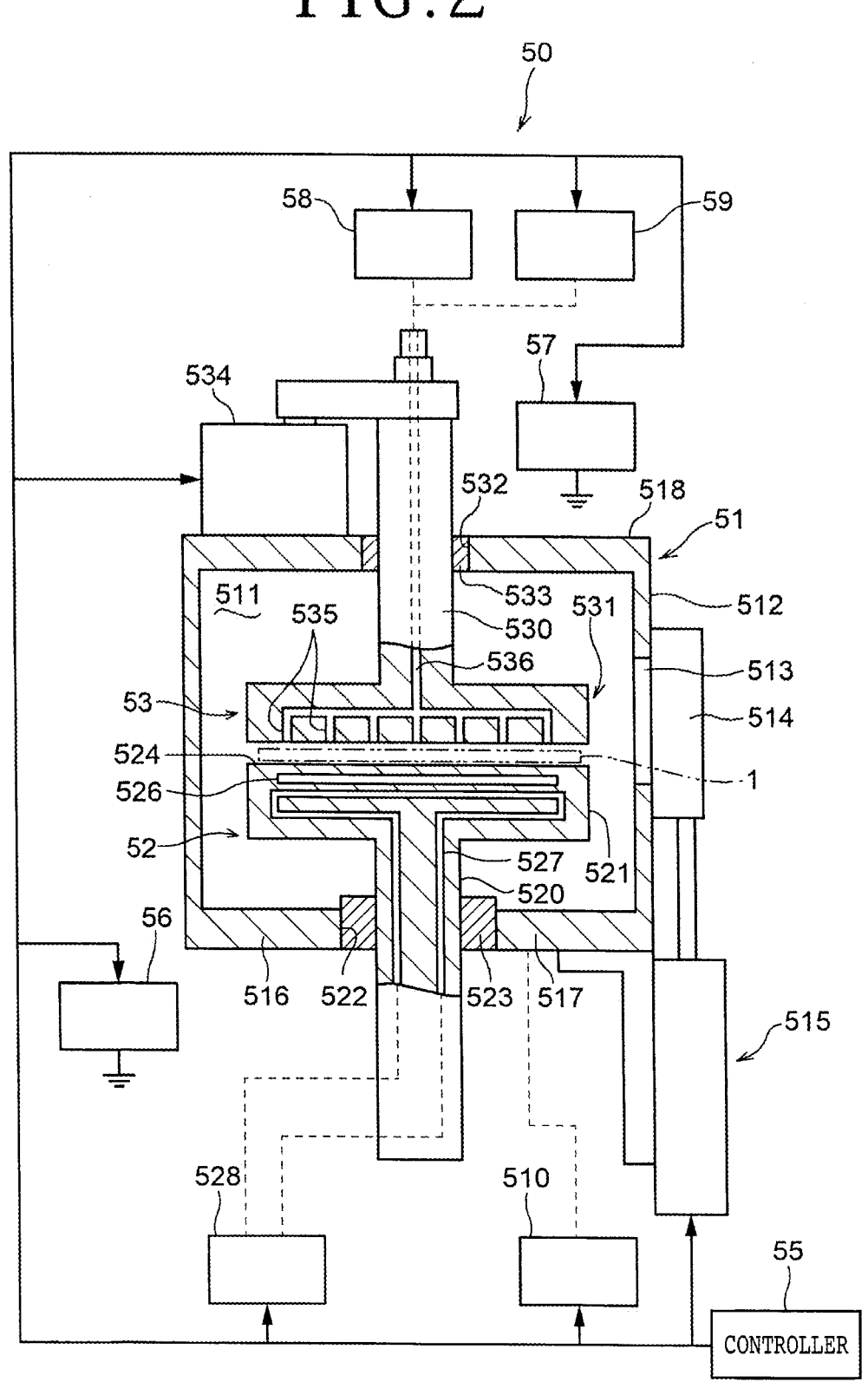
FIG. 2 is a cross-sectional view depicting an example of a plasma processing machine for use in the processing method according to the present invention.

FIG. 2 is a cross-sectional view depicting an example of a plasma processing machine 50 for use in the processing method according to the present invention. The plasma processing machine 50 includes a parallelepipedal chamber 51, a holding unit 52, an upper electrode 53, and a controller 55.

The chamber 51 internally defines a treatment space 511 in which plasma etching is performed. In a side wall 512 of the chamber 51, an opening 513 and an openable door 514 are disposed. The opening 513 is used to load or unload the device wafer 1, and the openable door 514 opens or closes the opening 513. The openable door 514 is lifted down or up by an opening/closing mechanism 515 configured with an air cylinder or the like, thereby opening or closing the opening 513.

Through a bottom wall 516 of the chamber 51, an exhaust port 517 is also formed to communicate the inside and the outside of the chamber 51. To the exhaust port 517, an exhaust system 510 such as a vacuum pump is connected.

The holding unit 52 and the upper electrode 53 are arranged opposite to each other inside the treatment space 511 of the chamber 51. The holding unit 52 serves at an upper surface thereof as a holding surface 524 that holds the device wafer 1 via a support member 22 (see FIG. 4A). The holding unit 52 is made from an electrically conductive material, and also functions as a lower electrode.

The holding unit 52 includes a disk-shaped holding portion 521, and a cylindrical support portion 520 extending downwards from a central portion of a lower surface of the holding portion 521. The support portion 520 is inserted through an opening 522 formed in the bottom wall 516 of the chamber 51. In the opening 522, an annular insulating member 523 is arranged between the bottom wall 516 and the support portion 520, so that the chamber 51 and the holding unit 52 are electrically insulated from each other. Further, the holding unit 52 is connected to a RF power supply 56 outside the chamber 51.

In the holding portion 521 of the holding unit 52, an electrode 526 is disposed. The electrode 526 is connected to an additional RF power supply (not depicted). Electric power is applied to the electrode 526 from the additional RF power supply to induce a dielectric polarization phenomenon between the holding surface 524 and the device wafer 1, whereby the device wafer 1 is attracted and held on the holding surface 524 by an electrostatic attraction force generated by charge polarization.

Inside the holding portion 521 of the holding unit 52 and inside the support portion 520, a cooling passage 527 is formed to allow a cooling fluid such as water to flow for cooling the holding unit 52. The cooling passage 527 is connected at opposite ends thereof to a coolant circulation system 528. When the coolant circulation system 528 is activated, the cooling fluid flows circulating through the cooling passage 527, so that the holding unit 52 is cooled.

The upper electrode 53 is made from an electrically conductive material, and includes a disk-shaped gas injection portion 531, and a cylindrical support portion 530 extending upwards from a central portion of an upper surface of the gas injection portion 531. The support portion 530 is inserted through an opening 532 formed in a top wall 518 of the chamber 51. In the opening 532, an annular insulating member 533 is arranged between the top wall 518 and the support portion 530, so that the chamber 51 and the upper electrode 53 are electrically insulated from each other.

The upper electrode 53 is connected to a RF power supply 57 outside the chamber 51. Further, a support arm of a lift mechanism 534 is attached to an upper end portion of the support portion 530. The upper electrode 53 is lifted up and down by the lift mechanism 534.

The gas injection portion 531 is provided on a side of a lower surface thereof with a plurality of injection orifices 535. The injection orifices 535 are connected to a first gas supply source 58 and a second gas supply source 59 via a flow passage 536 formed through the gas injection portion 531 and support portion 530. The first gas supply source 58 supplies a first gas from the injection orifices 535 into the chamber 51 through the flow passage 536. The second gas supply source 59 supplies a second gas from the injection orifices 535 into the chamber 51 through the flow passage 536. The first gas and the second gas, which are supplied from the first gas supply source 58 and the second gas supply source 59, respectively, may be different or the same. The first gas and second gas are appropriately selected according to the kind or the like of the base material 12 of the device wafer 1, and are each, for example, a simple substance gas of $CF_4$, $C_4F_8$, or $SF_8$, a mixed gas of $CF_4$ and Ar, a mixed gas of $C_4F_8$ and Ar, oxygen gas, or the like. The first gas and the second gas may be alternately supplied into the chamber 51, or may be concurrently supplied and used as a mixed gas.

The controller 55 controls individual elements of the plasma processing machine 50, and causes the plasma processing machine 50 to perform plasma etching on the device wafer 1.

To the controller 55, a display unit and an input unit are also connected. The display unit is configured with a liquid crystal display device or the like that displays a variety of information, images and the like, and the input unit is used when an operator records processing details information and the like. The input unit is configured with at least one of a touch panel disposed in the display unit, and an external input device such as a keyboard.

A description will hereinafter be made about a processing method that performs plasma dicing of a device wafer using the plasma processing machine 50 configured as described above.

Figure 3:
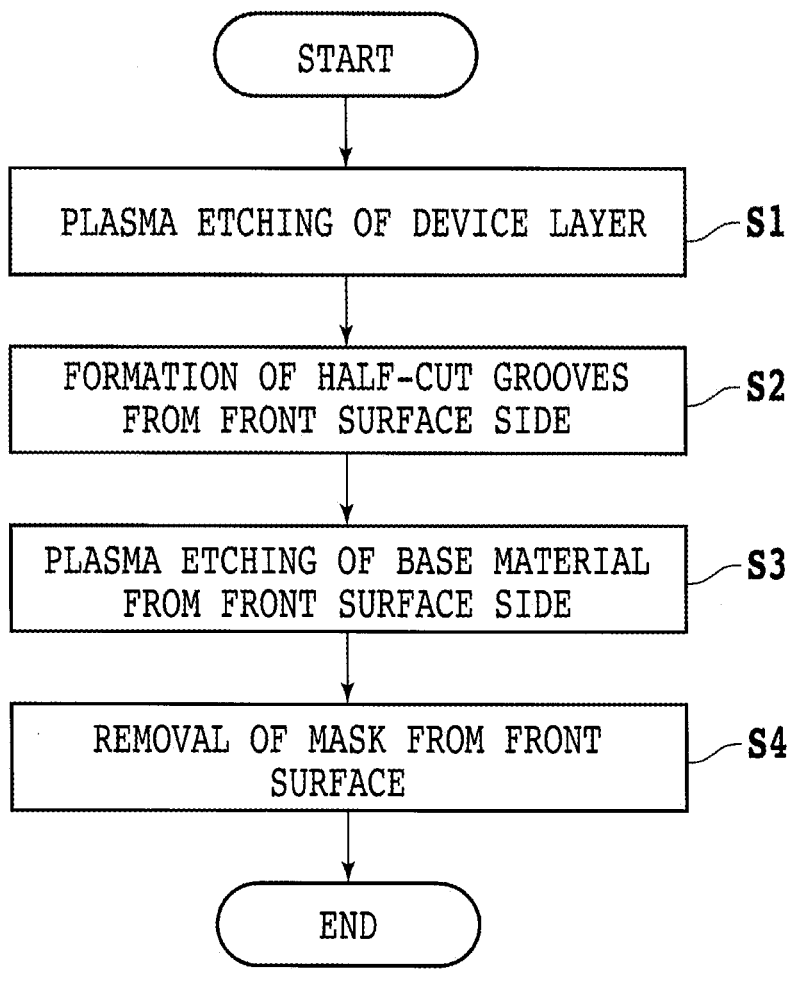
FIG. 3 is a flow chart of a processing method according to a first embodiment of the present invention for the device wafer.

FIG. 3 is a flow chart of a processing method according to a first embodiment of the present invention for the device wafer. In the first embodiment, half-cut grooves are formed from a side of a front surface of the device wafer (from a side where a device layer is formed), followed by plasma etching also from the side of the front surface of the device layer.

<Step S1: Plasma Etching of Device Layer>

As depicted in FIGS. 4A to 4D, a device layer 14 is divided by plasma etching along the streets 16. Each fragmentary cross-sectional view is a schematic view, so that the device layer 14, the base material 12, the support member 22, and the like are drawn exaggerated and can be appropriately changed in thickness, size and the like.

As depicted in FIG. 4A, the device wafer 1 is first fixed on the support member 22. Described specifically, the base material 12 of the device wafer 1 is bonded at a back surface 12b thereof to a front surface 22a of the support member 22 via an adhesive layer 25. It is to be noted that the adhesive layer 25 enables device chips to separate for pickup from the support member 22 after the device wafer 1 is subsequently divided into device chips and is allowed to function as a generally-called temporary adhesive layer.

Figures 5A, 5B, 5C, 5D:
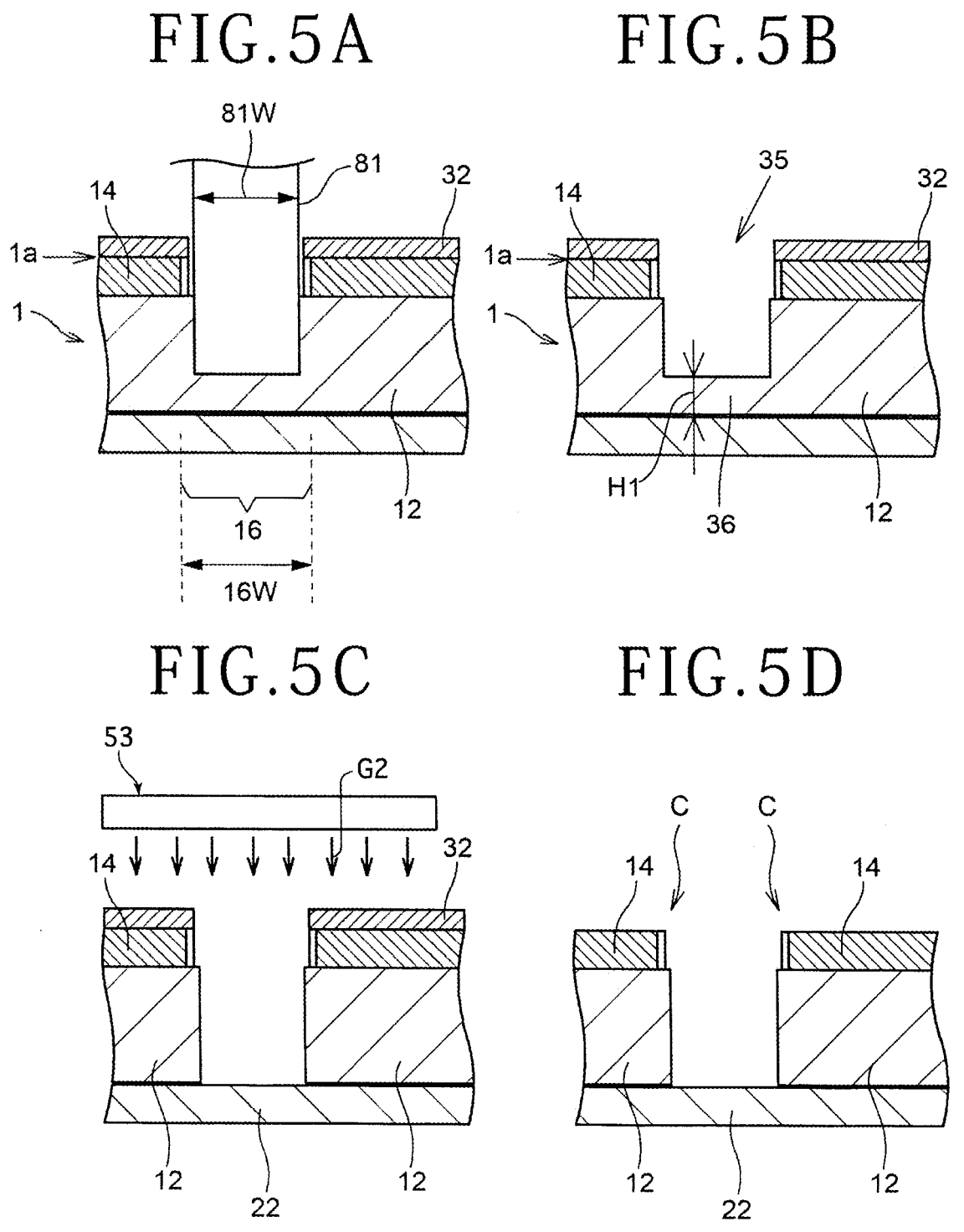

The support member 22 is a carrier wafer made from, for example, glass, silicon, or the like, and is formed as a disk-shaped plate material like the device wafer 1. Besides the disk-shaped plate, the support member 22 may also be a tape on which an annular frame is bonded surrounding the device wafer 1. The fixing of the device wafer 1 on the support member 22 needs to be performed before plasma etching of the base material 12 depicted in FIG. 5C is performed.

As depicted in FIG. 4B, a mask 32 of a resist resin is then formed on a front surface 14a of the device layer 14. This mask 32 is configured, for example, by forming two lines of openings 34 along each street 16 in a resist layer formed on the front surface 14a of the device layer 14 through patterning with an exposure system (not depicted).

Instead of using the exposure system, the formation of the mask 32 may also be performed, for example, by applying a water-soluble resin to the entire surface of the device layer 14 and curing it into a water-soluble resin layer, and then irradiating a laser beam to form the openings 34.

The formation of the mask 32 may also be performed, for example, by applying a water-insoluble resist resin to the entire surface of the device layer 14 and baking it into a resist layer, and then forming the openings 34 through processing with a cutting blade.

As a still further alternative, the mask 32 may also be formed by bonding a resist film to the device layer 14, and then forming the openings 34 in the resist film along the respective streets with a laser beam or a cutting blade.

Moreover, the formation of the openings 34 is not limited to the removal of the water-soluble resin layer, resist layer or resist film by the laser beam or cutting blade at the locations corresponding to the openings 34 as mentioned above, and may also be performed such that the water-soluble resin layer, resist layer or resist film is cut open (or cut aside) at the locations corresponding to the openings 34, for example, using a pen-type tool or a cutter (cutting edge).

As depicted in FIG. 4B, the openings 34 are formed along each street 16. If metal structures such as the TEGs 13 exist in the street 16, the openings 34 are configured in the form of two grooves within the range of a width 16W of the street 16, so that the metal structures are flanked between the grooves. The metal structures such as the TEGs 13 cannot be removed by plasma etching, so that the openings 34 are formed avoiding the metal structures.

If metal structures such as the TEGs 13 do not exist in each street 16 as depicted in FIG. 4C, on the other hand, an opening 34a consisting of a single line of groove is formed along the street 16 within the range of the width 16W of the street 16.

As depicted in FIG. 4D, plasma etching is then performed from a side of the mask 32, in other words, from a side of the front surface 1a of the device wafer 1 (from a side of the device layer 14). Here, for example, $CF_4$ is used as a gas G that etches the device layer 14, if the plurality of interlayer dielectrics that forms the device layer 14 is formed, for example, from $SiO_2$. Besides $CF_4$, a mixed gas of $CF_4$ and argon, a mixed gas of $C_4F_8$ and argon, oxygen gas, and the like may also be used.

By this plasma etching, the device layer 14 is etched off at the locations corresponding to the openings 34. In this manner, the device layer 14 is divided by the plasma etching along each street 16. In each street 16, a device layer portion 14c is left.

<Step S2: Formation of Half-Cut Grooves from Front Surface Side>

As depicted in FIGS. 5A and 5B, a half-cut groove 35 is formed along each street 16 in the base material 12 by a cutting blade 81 or a laser beam from a side of a front surface 1a of the device wafer 1. The formation of half-cut grooves 35 along the respective streets 16 should be performed before plasma etching of the base material 12, which will be described subsequently herein.

In the example depicted in FIG. 5A, the cutting blade 81 is caused to cut into the base material 12 while being moved along the street 16, whereby the half-cut groove 35 is formed as depicted in FIG. 5B. Described specifically, with the cutting blade 81 positioned at a predetermined cut-in height position and rotated at high speed, a holding table with the device wafer 1 held thereon is fed for processing, so that cutting processing is performed along the street 16 to form the half-cut groove 35. During the cutting processing, cutting water is supplied.

As depicted in FIG. 5A, the cutting blade 81 has a width 81W, which is set to be narrower than the width 16W of each street 16 but greater than a width 14W of the device layer portion 14c (see FIG. 4D) left in the street 16 after the plasma etching. It is therefore possible to remove, along with the TEGs 13, the device layer portion 14c left in each street 16 and depicted in FIG. 4D. If a laser beam is used, on the other hand, the half-cut groove 35 is formed by performing laser ablation processing on the base material 12 along each street 16.

When the half-cut groove 35 is formed along each street 16 as described above, a portion of the base material 12 is removed along with the device layer portion 14c (see FIG. 4D) and the metal structures such as the TEGs 13, whereby a remaining portion 36 of the base material 12 is formed at the bottom of the half-cut groove 35.

As indicated in FIG. 5B, the remaining portion 36 of the base material 12 has a thickness H1, which is appropriately set according to a cut-in depth feasible by the cutting blade 81, the configuration of the device layer 14, and so on. In order to shorten the time of plasma etching of the base material 12, however, the thickness H1 of the remaining portion 36 may preferably be set to be a half or less of the original thickness of the base material 12.

<Step S3: Plasma Etching of Base Material from Front Surface Side>

As depicted in FIGS. 5C and 5D, the remaining portions 36 are removed by subjecting the base material 12 to plasma etching along all the streets 16 from the side of the front surface 1a of the device wafer 1.

The plasma etching is performed, for example, by the Bosch process that alternately uses $C_4F_8$ and $SF_8$ as a gas G2. As a result of the removal of the remaining portions 36, the support member 22 is exposed, and the base material 12 is completely divided along the individual streets 16.

Processing debris occurred upon the formation of the half-cut grooves 35 is also removed when the remaining portions 36 of the base material 12 are removed by the plasma etching. The processing debris that occurs by the laser dicing or blade dicing is hence prevented from remaining as contaminants. Further, owing to the advance formation of the half-cut grooves 35, the thickness of the base material 12 (the thickness of each remaining portion 36) to be removed by the plasma etching is reduced, thereby enabling to shorten the processing time by plasma etching.

Concerning such contaminants, it is important to keep contaminant-free when manufacturing devices on which hybrid bonding is to be performed to directly join electrodes themselves of the devices or when manufacturing image sensor devices. The above-described processing method is hence particularly suited for the manufacture of such devices.

<Step S4: Removal of Mask from Front Surface>

As depicted in FIG. 5D, the mask 32 (see FIG. 5C) is removed. The removal of the mask 32 formed of the resist layer is performed, for example, by asking. If the mask 32 is formed with a water-soluble resin, on the other hand, the mask 32 is removed by washing.

As depicted in FIG. 5D, the base material 12 has been completely divided, and device chips C and C are arranged at an interval therebetween along each street 16 (see FIG. 5A) on the support member 22. These device chips C and C are subsequently picked up, and unloaded.

It is to be noted that, in the first embodiment described above, plasma etching is performed on the device layer 14 as depicted in FIG. 4D, the half-cut grooves 35 are then formed as depicted in FIGS. 5A and 5b, and plasma etching is then performed on the base material 12 as depicted in FIG. 5C. Without being limited to this order, the formation of the half-cut grooves 35 and the plasma etching on the base material 12 may be performed earlier, and plasma etching may then be performed on the device layer 14.

Figure 6:
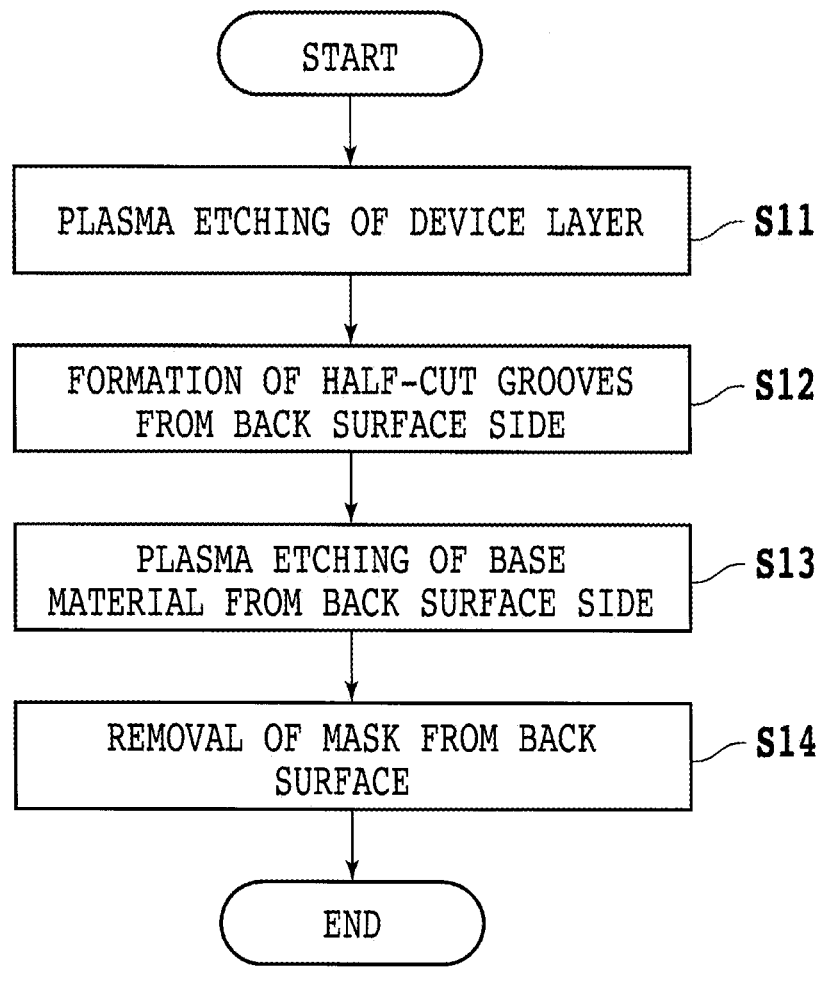
FIG. 6 is a flow chart of a processing method according to a second embodiment of the present invention for the device wafer.

FIG. 6 is a flow chart of a processing method according to a second embodiment of the present invention for the device wafer. In the second embodiment, half-cut grooves are formed from a side of a back surface of the device wafer (a side opposite to a side on which the device layer is formed), followed by plasma etching also from the side of the back surface of the device wafer.

<Step S11: Plasma Etching of Device Layer>

Figure 7A:
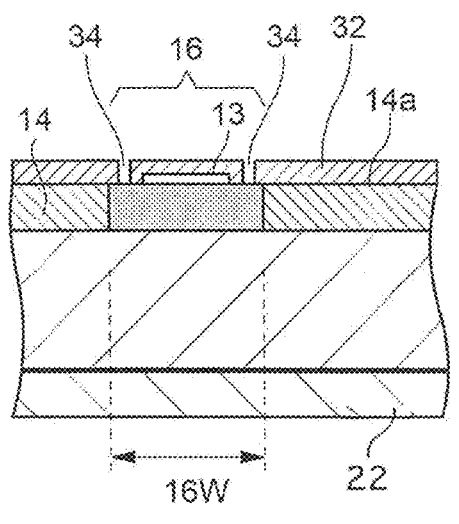
FIG. 7A is a fragmentary cross-sectional view depicting formation of a mask on a front surface of the device wafer in a first step of the processing method of FIG. 6.
Figure 7B:
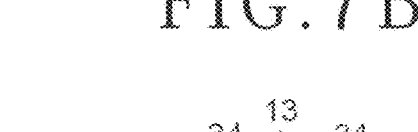
FIG. 7B is a fragmentary cross-sectional view depicting plasma etching of a device layer in the first step.
Figure 7C:
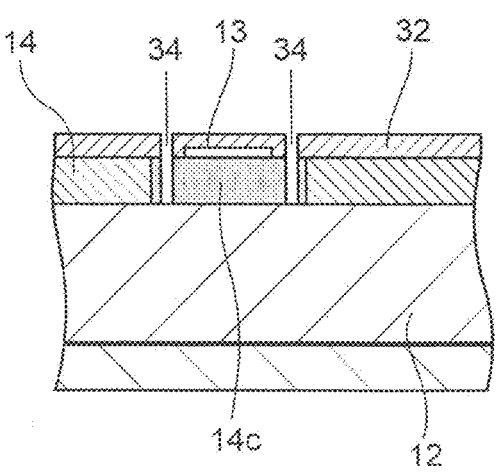
FIG. 7C is a fragmentary cross-sectional view depicting a portion of the device layer, the portion being left in each street, in the first step.

Similar to the first embodiment, as depicted in FIG. 7A, a mask 32 of a resist resin is first formed on a front surface 14a of a device layer 14, and as depicted in FIG. 7B, plasma etching is then performed from a side of the mask 32, in other words, from a side of a front surface 1a (a side of the device layer 14) of a device wafer 1, thereby dividing the device layer 14 along each street 16. As depicted in FIG. 7C, a device layer portion 14c so divided is left in each street 16.

Figure 7D:
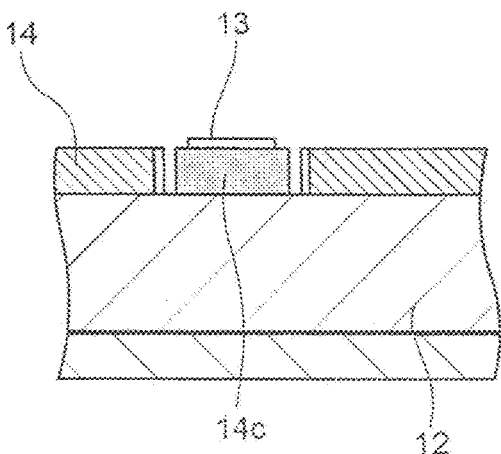
FIG. 7D is a fragmentary cross-sectional view depicting a state, in which the mask has been removed, in the first step.

The mask 32 is then removed as depicted in FIG. 7D. The removal of the mask 32 is performed, for example, by asking. It is to be noted that use of a support member 22 may be omitted in Step S11 of FIGS. 7A to 7D.

<Step S12: Formation of Half-Cut Grooves from Back Surface Side>

Figure 8A:
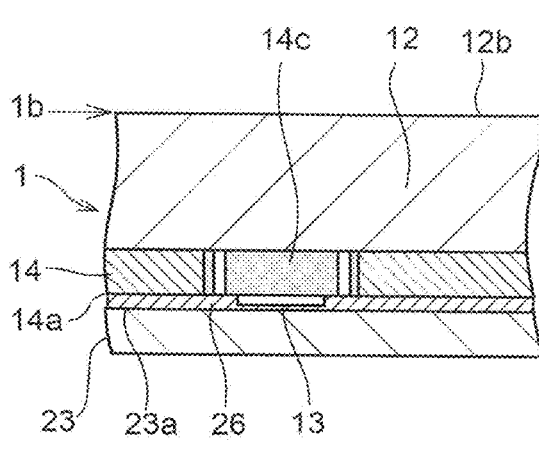
FIG. 8A is a fragmentary cross-sectional view depicting the device wafer fixed on a support member in a second step of the processing method of FIG. 6.

As depicted in FIG. 8A, the device wafer 1 is next fixed on a support member 23. Described specifically, the front surface 14a of the device layer 14 of the device wafer 1 is bonded to a front surface 23a of the support member 23 via an adhesive layer 26. It is to be noted that the support member 23 and adhesive layer 26 and their functions are similar to the support member 23 and adhesive layer 25 and their functions in the first embodiment.

Figure 8B:
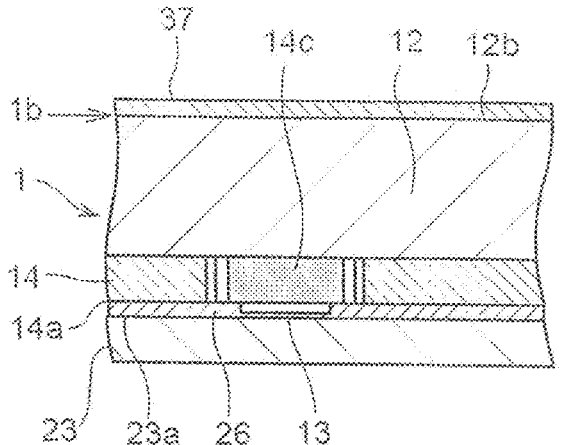
FIG. 8B is a fragmentary cross-sectional view depicting formation of a mask on a back surface of the device wafer in the second step.

As depicted in FIG. 8B, a mask 37 of a resist resin is then formed on a back surface 1b of the device wafer 1, in other words, a back surface 12b of a base material 12.

This mask 37 is configured with, for example, a resist layer formed by applying a water-insoluble resist resin to the entire area of the back surface 12b of the base material 12 and then baking it if half-cut grooves 38 (see FIG. 8D) are to be subsequently formed by the cutting blade 81 (see FIG. 8C).

The mask 37 may also be formed, for example, by applying a water-soluble resin to the entire area of the back surface 12b of the base material 12 and then curing it if the half-cut grooves 38 are to be subsequently formed by a laser beam.

Besides, the mask 37 may also be formed by bonding a resist film to the back surface 12b of the base material 12.

Figure 8C:
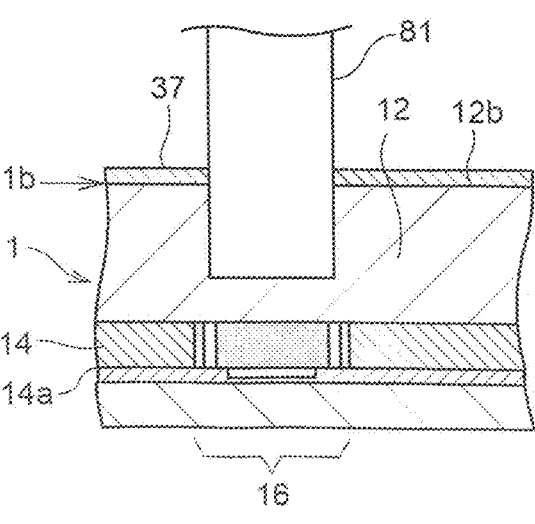
FIG. 8C is a fragmentary cross-sectional view depicting the formation of a half-cut groove along the street in the second step.
Figure 8D:
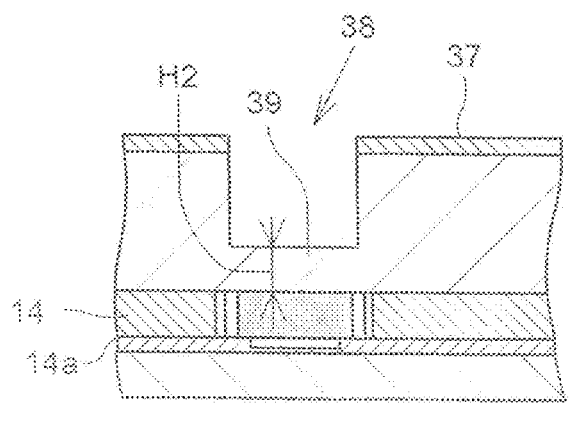
FIG. 8D is a fragmentary cross-sectional view depicting the half-cut groove formed along the street in the second step.

As depicted in FIGS. 8C and 8D, the half-cut groove 38 is formed along each street 16 in the base material 12 by the cutting blade 81 or the laser beam from a side of the back surface 1b of the device wafer 1.

The formation of the half-cut grooves 38 along the respective streets 16 should be performed before plasma etching of the base material 12, which will be described subsequently herein.

In the example depicted in FIG. 8C, the cutting blade 81 is caused to cut into the base material 12 while being moved along the street 16, whereby the half-cut groove 38 is formed as depicted in FIG. 8D. Specific procedures are similar to those in the first embodiment.

If a laser beam is used, on the other hand, the half-cut groove 38 is formed by performing laser ablation processing on the base material 12 along each street 16.

When the half-cut groove 38 is formed along each street 16 as described above, portions of the mask 37 and base material 12, the portions being located at the position of the street 16, are removed, whereby a remaining portion 39 of the base material 12 is formed at the bottom of the half-cut groove 38.

As indicated in FIG. 8D, the remaining portion 39 of the base material 12 has a thickness H2, which is appropriately set according to a cut-in depth feasible by the cutting blade 81, and the like. In order to shorten the time of plasma etching of the base material 12, however, the thickness H2 of the remaining portion 39 may preferably be set to be a half or less of the original thickness of the base material 12.

<Step S13: Plasma Etching of Base Material from Back Surface Side>

Figures 9A, 9B:
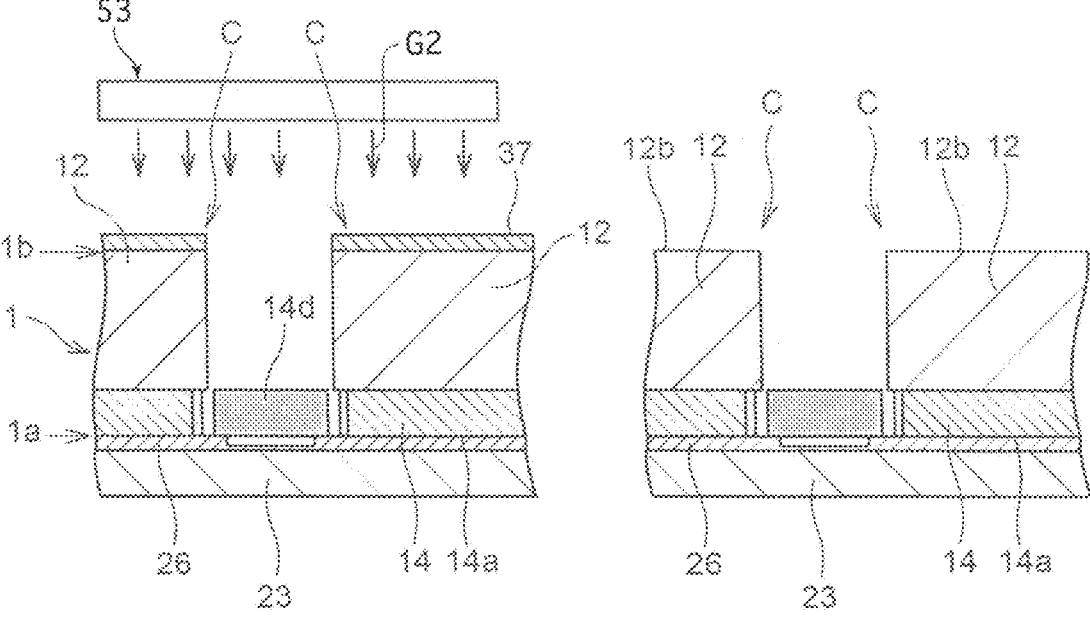
FIG. 9A is a fragmentary cross-sectional view depicting plasma etching of the base material in a third step of the processing method of FIG. 6.
FIG. 9B is a fragmentary cross-sectional view depicting a state, in which the mask has been removed from the back surface of the device wafer, in a fourth step of the processing method of FIG. 6.

As depicted in FIG. 9A, the remaining portions 39 (see FIG. 8D) are removed by subjecting the base material 12 to plasma etching along all the streets 16 from the side of the back surface 1b of the device wafer 1.

The plasma etching of the base material 12 is performed by the Bosch process as in the first embodiment. As a result of the removal of the remaining portions 39 (see FIG. 8D), the base material 12 is completely divided along each street 16, and on the support member 23, a device layer portion 14d separated from device chips C and C on both sides of the street 16 is left. All the device layer portions 14d separated as described above are left bonded and fixed on the support member 23 via the adhesive layer 26, thereby preventing occurrence of an inconvenience such as contaminants that would otherwise be produced by scattering or the like of the device layer portions 14d.

Processing debris occurred upon the formation of the half-cut grooves 38 is also removed when the remaining portions 39 (see FIG. 8D) of the base material 12 are removed by the plasma etching. The processing debris that occurs by the laser dicing or blade dicing is hence prevented from remaining as contaminants. Further, owing to the advance formation of the half-cut grooves 38, the thickness of the base material 12 (the thickness of each remaining portion 39) to be removed by the plasma etching is reduced, thereby enabling to shorten the processing time by plasma etching.

Concerning such contaminants, it is important to keep contaminant-free when manufacturing devices on which hybrid bonding is to be performed to directly join electrodes themselves of the devices or when manufacturing image sensor devices. The above-described processing method is hence particularly suited for the manufacture of such devices.

<Step S14: Removal of Mask from Back Surface>

As depicted in FIG. 9B, the mask 37 (see FIG. 9A) is removed. The removal of the mask 37 formed of the resist layer is performed, for example, by asking. If the mask 37 is formed with a water-soluble resin, on the other hand, the mask 37 is removed by washing.

As depicted in FIG. 9B, the base material 12 has been completely divided, and device chips C and C are arranged at an interval therebetween along each street 16 (see FIG. 8C) on the support member 23. These device chips C and C are subsequently picked up, and unloaded. It is to be noted that, at the stage of FIG. 9B, thinning of the device chips C may be performed by grinding the base material 12 from the side of the back surface 12b.

It is also to be noted that, in the second embodiment described above, plasma etching is performed on the device layer 14 as depicted in FIG. 7B, the half-cut grooves 38 are then formed as depicted in FIGS. 8C and 8D, and plasma etching is then performed on the base material 12 as depicted in FIG. 9A. Without being limited to this order, the formation of the half-cut grooves 38 and the plasma etching on the base material 12 may be performed earlier, and plasma etching may then be performed on the device layer 14.

As understood from the foregoing, the terms "first step", "second step" and "third step", the abbreviations "S1", "S2", "S3" and "S4", and the abbreviations "S11", "S12", "S13" and "S14" as used herein do not indicate the order of these steps except for the description of the first and second embodiments.

The configuration, method, and the like relating to the embodiments and modification examples described above can further be implemented in appropriate modified manners without departing from the scope of the object of the present invention. For example, the device layer 14 may be divided by a laser beam or a cutting blade, instead of the plasma etching, along each street 16.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method for processing a device wafer, in which a device layer, the device layer constituting devices, is stacked on a base material and the devices are formed, respectively, in regions defined by a plurality of intersecting streets on a front surface of the base material, the method comprising:

a first step of dividing the device layer along the streets, wherein metal structures are formed in each of the streets;

a second step of dividing the base material by plasma etching along the streets; and a third step of, before performing at least the second step, forming half-cut grooves by a cutting blade or a laser beam in the base material along the streets, respectively, from one of a side of a front surface or a side of a back surface of the device wafer, wherein the third step and the second step are performed from the side of the same surface of the device wafer.

2. The method for processing a device wafer according to claim 1, wherein a mask is formed on the metal structures and the device layer, in the first step, two grooves are formed along each street and through the mask, so that the two grooves divide the device layer and flank the metal structures, and after the first step has been performed, the third step is performed, and the second step is then performed.

3. The method for processing a device wafer according to claim 2, wherein, in the third step, the base material is removed along with the metal structures along each street from the side of the front surface of the device wafer, so that the half-cut groove is formed in the base material and a remaining portion of the base material is formed below the half-cut groove, and in the second step, a plasma gas is supplied from the side of the front surface of the device wafer, so that plasma etching is performed on the remaining portion and processing debris occurred upon the formation of the half-cut groove in the third step is removed.

4. The method for processing a device wafer according to claim 2, wherein, in the third step, the half-cut groove is formed in the base material from the side of the back surface of the device wafer, and a remaining portion of the base material is formed below the half-cut portion, and in the second step, a plasma gas is supplied from the side of the back surface of the device wafer, so that plasma etching is performed on the remaining portion and processing debris occurred upon the formation of the half-cut groove in the third step is removed.

5. The method for processing a device wafer according to claim 1, further comprising attaching each of the metal structures to a device portion of the device layer in each of the streets.

6. A method for processing a device wafer, in which a device layer, the device layer constituting devices, is stacked on a base material and the devices are formed, respectively, in regions defined by a plurality of intersecting streets on a front surface of the base material, the method comprising:

a first step of dividing the device layer by plasma etching along the streets, wherein metal structures are formed in each of the streets;

a second step of dividing the base material by plasma etching along the streets; and a third step of, before performing at least the second step, forming half-cut grooves by a cutting blade or a laser beam in the base material along the streets, respectively, from one of a side of a front surface or a side of a back surface of the device wafer, wherein the third step and the second step are performed from the side of the same surface of the device wafer.

7. The method for processing a device wafer according to claim 6, wherein metal structures are formed in each of the streets, wherein a mask is formed on the metal structures and the device layer, in the first step, two grooves are formed along each street and through the mask, so that the two grooves divide the device layer and flank the metal structures, and after the first step has been performed, the third step is performed, and the second step is then performed.

8. The method for processing a device wafer according to claim 7, wherein, in the third step, the base material is removed along with the metal structures along each street from the side of the front surface of the device wafer, so that the half-cut groove is formed in the base material and a remaining portion of the base material is formed below the half-cut groove, and in the second step, a plasma gas is supplied from the side of the front surface of the device wafer, so that plasma etching is performed on the remaining portion and processing debris occurred upon the formation of the half-cut groove in the third step is removed.

9. The method for processing a device wafer according to claim 7, wherein, in the third step, the half-cut groove is formed in the base material from the side of the back surface of the device wafer, and a remaining portion of the base material is formed below the half-cut portion, and in the second step, a plasma gas is supplied from the side of the back surface of the device wafer, so that plasma etching is performed on the remaining portion and processing debris occurred upon the formation of the half-cut groove in the third step is removed.

10. The method for processing a device wafer according to claim 6, further comprising attaching each of the metal structures to a device portion of the device layer in each of the streets.

* * * * *